US012789819B2

(12) United States Patent
Ono

(10) Patent No.: US 12,789,819 B2
(45) Date of Patent: Nov. 10, 2026

(54) IN-VEHICLE CONTROL DEVICE, CONTROL METHOD, AND COMPUTER PROGRAM

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Norihiro Ono, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 50 days.

(21) Appl. No.: 18/837,745

(22) PCT Filed: Feb. 6, 2023

(86) PCT No.: PCT/JP2023/003763

§ 371 (c)(1),
(2) Date: Aug. 12, 2024

(87) PCT Pub. No.: WO2023/162648

PCT Pub. Date: Aug. 31, 2023

(65) Prior Publication Data

US 2025/0145164 A1 May 8, 2025

(30) Foreign Application Priority Data

Feb. 22, 2022 (JP) ................................ 2022-025586

(51) Int. Cl.
*B60W 50/00* (2006.01)
*G01R 31/387* (2019.01)

(52) U.S. Cl.
CPC .......... *B60W 50/00* (2013.01); *G01R 31/387* (2019.01); *B60W 2420/408* (2024.01); *B60W 2556/45* (2020.02)

(58) Field of Classification Search
CPC ............ B60W 50/00; B60W 2556/45; B60W 2420/408; G01R 31/387
(Continued)

(56) References Cited

U.S. PATENT DOCUMENTS 9,978,018 B2 * 5/2018 Johnson .................. H04W 4/38
2004/0102228 A1 5/2004 Hakamata et al.
(Continued)

FOREIGN PATENT DOCUMENTS

JP H9-252360 A 9/1997
JP 2001-145168 A 5/2001
(Continued)

OTHER PUBLICATIONS

International Search Report, Application No. PCT/JP2023/003763, mailed Mar. 7, 2023. ISA/Japan Patent Office.

*Primary Examiner* — Matthias S Weisfeld
(74) *Attorney, Agent, or Firm* — Brooks Kushman P.C.

(57) ABSTRACT

An in-vehicle control device disclosed herein is an in-vehicle control device to be mounted in a vehicle and includes a control unit that transmits at least some of vehicle data collected by the vehicle to an external device that is provided outside of the vehicle and communicates with the in-vehicle control device via a network. When an ignition switch of the vehicle is switched off, the control unit executes calculation control for calculating a transmittable amount of the vehicle data based on a remaining battery charge of the vehicle, extraction control for extracting, from the vehicle data, first data that fits within the transmittable amount, and first transmission control for transmitting the
(Continued)

first data to the external device and not transmitting second data that is different from the first data out of the vehicle data to the external device.

12 Claims, 4 Drawing Sheets

(58) Field of Classification Search
USPC .............................................................. 701/1
See application file for complete search history.

(56) References Cited

U.S. PATENT DOCUMENTS

| | | | | |
|---|---|---|---|---|
| 2019/0124275 | A1* | 4/2019 | Murad | H04N 23/56 |
| 2021/0097784 | A1* | 4/2021 | Castano | G07C 5/008 |
| 2021/0406082 | A1* | 12/2021 | Asao | G06F 9/3871 |
| 2022/0358382 | A1* | 11/2022 | Gotesdyner | G06F 1/3206 |
| 2023/0078214 | A1* | 3/2023 | Khati | H04L 67/1087 |
| 2023/0286467 | A1* | 9/2023 | Obayashi | B60S 1/52 |
| 2025/0330708 | A1* | 10/2025 | Jeong | H04N 23/681 |

FOREIGN PATENT DOCUMENTS

| | | | | |
|---|---|---|---|---|
| JP | 2015-052843 | A | 3/2015 | |
| JP | 2017-221016 | A1 | 12/2017 | |
| WO | WO-2007040119 | A1 * | 4/2007 | G08G 1/09 |

* cited by examiner

IN-VEHICLE CONTROL DEVICE, CONTROL METHOD, AND COMPUTER PROGRAM

CROSS-REFERENCE TO RELATED APPLICATIONS

This application is the U.S. national stage of PCT/JP2023/003763 filed on Feb. 6, 2023, which claims priority of Japanese Patent Application No. JP 2022-025586 filed on Feb. 22, 2022, the contents of which are incorporated herein.

TECHNICAL FIELD

The present disclosure relates to an in-vehicle control device, a control method, and a computer program.

BACKGROUND

A technique for transmitting data relating to a vehicle (vehicle data) collected by an in-vehicle control device to an external device provided outside of the vehicle is known. For example, JP 2015-52843A discloses a technique in which an in-vehicle communication device transmits image capture information (information acquired by an image capture device such as a drive recorder) and vehicle information (information such as the position of the vehicle, the traveling speed of the vehicle, and the brake depression amount) to an accident information collection device via a wireless base station and a network.

In recent years, the amount of vehicle data collected by in-vehicle control devices has been increasing. While the vehicle is traveling, the in-vehicle control device transmits vehicle data to an external device via a network in accordance with a communication method relating to mobile communication such as 3G (third generation mobile communication system), 4G/LTE (fourth generation mobile communication system/Long Term Evolution; LTE is a registered trademark) or 5G (fifth generation mobile communication system).

Although these communication methods relating to mobile communication can be used even while the vehicle is traveling, compared to communication methods such as Wi-Fi (registered trademark), they have issues such as limitations on data communication capacity, slow data transfer speeds, and high communication fees. For this reason, it is conceivable that the vehicle data collected while the vehicle is traveling is transmitted using a communication method such as Wi-Fi when the vehicle is parked in a parking lot or the like.

On the other hand, when the vehicle is parked, the engine of the vehicle is stopped, and therefore the in-vehicle control device needs to transmit vehicle data within the range of the remaining battery charge of the vehicle.

The present disclosure has been made in view of the above circumstances, and aims to more suitably transmit vehicle data collected in a vehicle to an external device even when the vehicle has a low remaining battery charge.

SUMMARY

An in-vehicle control device according to the present disclosure includes a control unit configured to transmit at least some of vehicle data collected in the vehicle to an external device that is provided outside of the vehicle and is configured to communicate with the in-vehicle control device via a network, in which the control unit executes: calculation control for calculating a transmittable amount of the vehicle data based on a remaining battery charge of the vehicle if an ignition switch of the vehicle is switched off; extraction control for extracting first data that fits within the transmittable amount from the vehicle data; and first transmission control for transmitting the first data to the external device and not transmitting second data that is different from the first data out of the vehicle data to the external device.

A control method according to the present disclosure includes: a calculation step of calculating, if an ignition switch of the vehicle is switched off, a transmittable amount according to which vehicle data collected in the vehicle is capable of being transmitted to an external device that is provided outside of the vehicle and is configured to communicate with the in-vehicle control device via a network, the transmittable amount being calculated based on a remaining battery charge of the vehicle; an extraction step of extracting first data that fits within the transmittable amount from the vehicle data; and a first transmission step of transmitting the first data to the external device and not transmitting second data that is different from the first data out of the vehicle data to the external device.

A computer program according to the present disclosure is a computer program for controlling an in-vehicle control device to be mounted in a vehicle, the computer program causing a computer to execute: a calculation step of calculating, if an ignition switch of the vehicle is switched off, a transmittable amount according to which vehicle data collected in the vehicle is capable of being transmitted to an external device that is provided outside of the vehicle and is configured to communicate with the in-vehicle control device via a network, the transmittable amount being calculated based on a remaining battery charge of the vehicle; an extraction step of extracting first data that fits within the transmittable amount from the vehicle data; and a first transmission step of transmitting the first data to the external device and not transmitting second data that is different from the first data out of the vehicle data to the external device.

Advantageous Effects

According to the present disclosure, vehicle data collected in the vehicle can be more suitably transmitted to an external device even when the remaining battery charge of the vehicle is low.

DETAILED DESCRIPTION OF PREFERRED EMBODIMENTS

Figure 1:
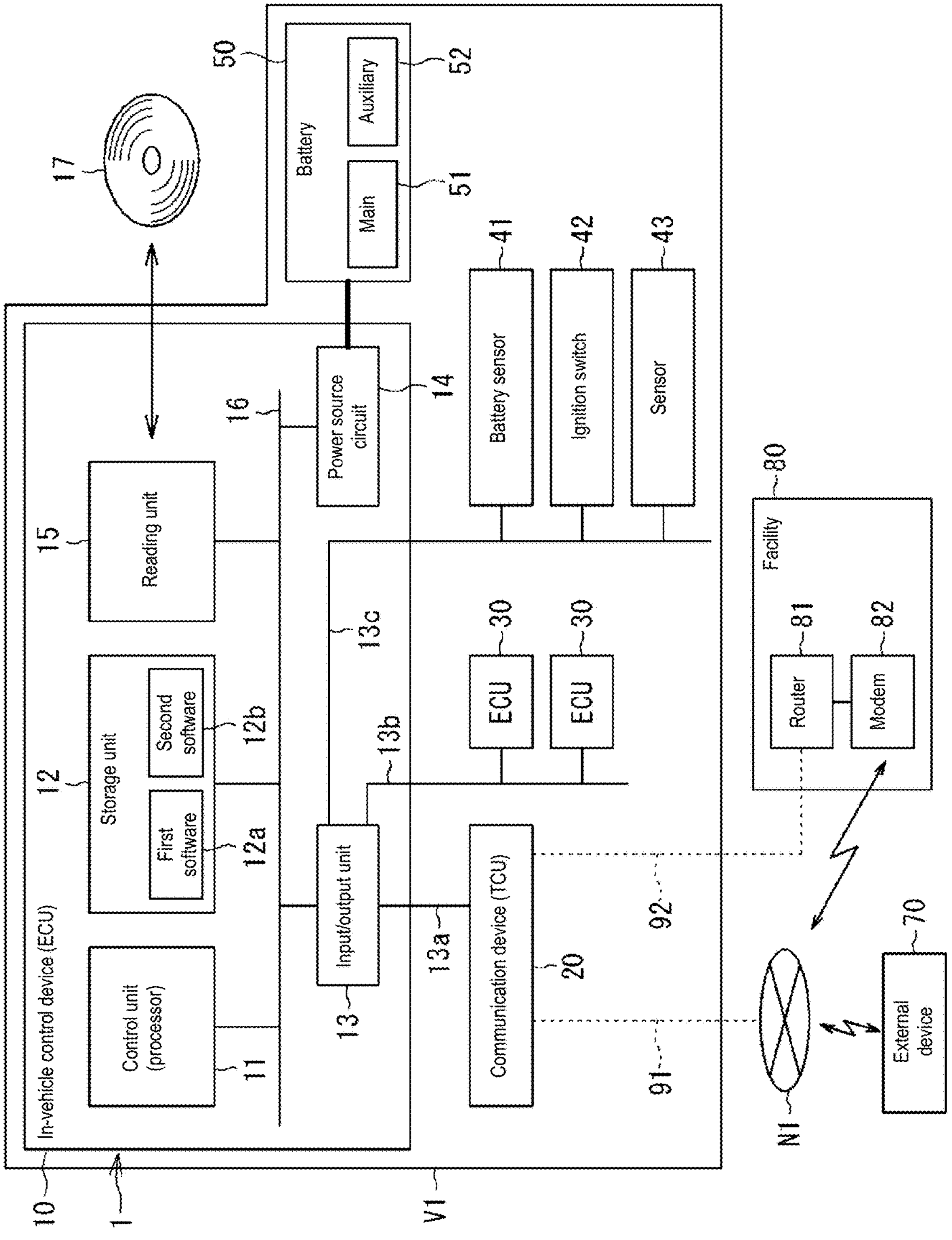
FIG. 1 is a schematic diagram illustrating an in-vehicle control system according to an embodiment.

Hereinafter, an overview of embodiments of the present disclosure will be listed and described.

An in-vehicle control device according to the present disclosure includes a control unit configured to transmit at least some of vehicle data collected in the vehicle to an external device that is provided outside of the vehicle and is configured to communicate with the in-vehicle control device via a network, in which the control unit executes:

calculation control for calculating a transmittable amount of the vehicle data based on a remaining battery charge of the vehicle if an ignition switch of the vehicle is switched off, extraction control for extracting first data that fits within the transmittable amount from the vehicle data; and first transmission control for transmitting the first data to the external device and not transmitting second data that is different from the first data out of the vehicle data to the external device.

With this configuration, the vehicle data collected in the vehicle can be more suitably transmitted to the external device even when the remaining battery charge of the vehicle is low.

The extraction control may include a first extraction operation of extracting, as the first data, data collected in a predetermined travel region out of the vehicle data.

With this configuration, the external device can preferentially acquire vehicle data that is useful for road condition analysis and accident analysis even when the remaining battery charge of the vehicle is low.

The travel region may include a first travel region and a second travel region adjacent to the first travel region, and the first extraction control may include: priority control for extracting data collected in the first travel region out of the vehicle data, as the first data; and control for further extracting, from data collected in the second travel region out of the vehicle data, data sampled uniformly over time according to a remaining amount obtained by subtracting the first data extracted in the preferential control from the transmittable amount, as the first data.

Due to the priority control, the first data preferentially includes data collected in the first driving region, and therefore the in-vehicle control device can transmit particularly useful data to the external device even when the remaining battery charge is low. This allows the external device to more reliably acquire vehicle data that is more useful for road condition analysis and accident analysis even if the total amount of vehicle data that can be transmitted is small.

The extraction control may include second extraction control for extracting, out of the vehicle data, at least one of data collected while a speed of the vehicle exceeds a predetermined speed and data collected while an absolute value of acceleration of the vehicle exceeds a predetermined value, as the first data.

When a vehicle is traveling at a high speed or is in an abnormal travel state such as sudden acceleration or deceleration, there is a high probability that the vehicle will be involved in an accident, and furthermore, there is a high likelihood that an abnormality has occurred in the surrounding area of the vehicle, and therefore vehicle data collected in such a region is useful for road condition analysis and accident analysis. In the second extraction control, vehicle data in such a region is preferentially extracted, and therefore the external device can preferentially obtain vehicle data that is useful for road condition analysis and accident analysis even if the total amount of vehicle data that can be transmitted is small.

The extraction control may include control for extracting, from the vehicle data, data sampled uniformly over time according to the transmittable amount, as the first data.

With this configuration, even if the remaining charge of the battery is low, vehicle data in a time span corresponding to the scheduled transmission amount can be transmitted evenly. This allows the external device to analyze the overall trend of the vehicle data even if the total amount of vehicle data that can be transmitted is small.

After executing the first transmission control, the control unit executes second transmission control for transmitting the second data to the external device if the remaining battery charge of the vehicle has increased.

This allows the external device to acquire the remaining vehicle data.

The control unit may acquire the remaining battery charge based on an SOC and an SOH of the battery mounted in the vehicle.

The control unit may communicate with the external device via a communication device mounted in the vehicle, the communication device may be capable of switching between a first route for communicating with the external device using a mobile communication method, and a second route for communicating with the external device via a router and a modem using a short-distance communication method in which the range of radio waves is shorter than in the mobile communication method, and the first transmission control may be executed when the communication device is communicating with the external device through the second route.

With this configuration, an increase in communication cost can be suppressed.

The control unit may execute first control for collecting the vehicle data while the vehicle is traveling, the control unit may execute second control including the calculation control, the extraction control, and the first transmission control while the vehicle is parked, and the control unit does not collect the vehicle data while executing the second control.

In this way, by limiting the vehicle data collection function of the in-vehicle control device while the vehicle is parked, it is possible to suppress the power consumption of the battery.

The in-vehicle control device may further include a storage unit that stores first software configured to execute the first control and second software configured to execute the second control, the control unit may execute the first software while the vehicle is traveling, when the ignition is switched off, the control unit may start the second software, and when the ignition is switched on after the first transmission control, the control unit may start the first software.

In this way, the second software can be operated without being influenced by the parameters accumulated during the operation of the first software, and therefore it is possible to reduce the risk of the control unit malfunctioning, and the like, and it is possible to more reliably suppress battery consumption during operation of the second software.

A control method according to the present disclosure includes: a calculation step of calculating, if an ignition switch of the vehicle is switched off, a transmittable amount according to which vehicle data collected in the vehicle is capable of being transmitted to an external device that is provided outside of the vehicle and is configured to communicate with the in-vehicle control device via a network, the transmittable amount being calculated based on a remaining battery charge of the vehicle; an extraction step of extracting first data that fits within the transmittable amount from the vehicle data; and a first transmission step of transmitting the first data to the external device and not transmitting second data that is different from the first data out of the vehicle data to the external device.

With this configuration, even if the remaining battery charge of the vehicle is low, the vehicle data collected in the vehicle can be more suitably transmitted to the external device.

An computer program according to the present disclosure is a computer program for controlling an in-vehicle control device to be mounted in a vehicle, the computer program causing a computer to execute: a calculation step of calculating, if an ignition switch of the vehicle is switched off, a transmittable amount according to which vehicle data collected in the vehicle is capable of being transmitted to an external device that is provided outside of the vehicle and is configured to communicate with the in-vehicle control device via a network, the transmittable amount being calculated based on a remaining battery charge of the vehicle; an extraction step of extracting first data that fits within the transmittable amount from the vehicle data; and a first transmission step of transmitting the first data to the external device and not transmitting second data that is different from the first data out of the vehicle data to the external device.

With this configuration, even if the remaining charge of the battery of the vehicle is low, the vehicle data collected in the vehicle can be more suitably transmitted to the external device.

Hereinafter, details of embodiments of the present disclosure will be described with reference to the drawings.

Overall Configuration of In-Vehicle Control System 1

FIG. 1 is a schematic diagram illustrating an in-vehicle control system 1 according to an embodiment.

The in-vehicle control system 1 is a system mounted in a vehicle V1, and is a system that transmits vehicle data TD1 collected by the vehicle V1 to an external device 70. The vehicle control system 1 includes an in-vehicle control device 10, a communication device 20, one or more ECUs 30, a battery sensor 41, an ignition switch 42, a sensor 43, and a battery 50.

The vehicle V1 is, for example, an automobile, but the type of the vehicle V1 is not particularly limited. The vehicle V1 may be an automobile that uses an engine such as a gasoline engine or a diesel engine as a power source, an automobile that uses an electric motor as a power source, or a hybrid automobile that combines these power sources.

The in-vehicle control device 10 is a device mounted in the vehicle V1, and is also called an ECU (Electronic Control Unit). The internal configuration of the in-vehicle control device 10 will be described later.

The communication device 20 is, for example, a TCU (Telematics Communication Unit), and performs wireless communication with the external device 70 via a network N1 (including a base station), which is a telecommunication network such as the Internet. The communication device 20 appropriately selects between a first route for performing wireless communication with the external device 70 using a mobile communication method 91 and a second route for performing wireless communication with the external device 70 via a router 81 and a modem 82 using a short-distance communication method 92, depending on the state of the vehicle V1 or the like. For this reason, the communication device 20 includes an antenna compatible with the mobile communication method 91 and an antenna compatible with the short-distance communication method 92. The communication device 20 is connected to, for example, an input/output unit 13 (described later) via a communication line 13*a*.

The external device 70 is a device provided outside of the vehicle V1. The external device 70 is installed, for example, in a management facility of a service provider that provides various services (e.g., a road guidance service, a driving assistance service, etc.) to the vehicle V1. The external device 70 is, for example, a server including a control unit, a storage unit, and a communication unit (none of which are shown in the drawings). The external device 70 communicates with, for example, a plurality of vehicles V1 via the network N1, and stores vehicle data TD1 transmitted to the external device 70 from each of the plurality of vehicles V1 in the storage unit of the external device 70.

The mobile communication method 91 is a communication method related to mobile communication, such as 3G (third generation mobile communication system), 4G/LTE (fourth generation mobile communication system/Long Term Evolution; LTE is a registered trademark), or 5G (fifth generation mobile communication system).

The short-distance communication method 92 is, for example, a wireless LAN (Local Area Network) such as Wi-Fi (registered trademark). The short-distance communication method 92 may be a communication method such as ZigBee (registered trademark) or Bluetooth (registered trademark). The range of radio waves emitted from the antenna of the communication device 20 using the short-distance communication method 92 is, for example, within 100 m, which is shorter than the range of radio waves emitted when the mobile communication method 91 is used.

The router 81 and the modem 82 are installed in, for example, a facility 80 used by a user of the vehicle V1 (e.g., a consumer of a road guidance service, etc.). The facility 80 is, for example, an office where the user works, or a store or parking lot used by the user.

The communication device 20 basically communicates with the external device 70 via the first route (mobile communication method 91). Then, when the vehicle V1 enters a parking lot that is within the facility 80 or adjacent to the facility 80 and becomes able to communicate with the router 81 using the short-distance communication method 92, the communication device 20 switches from the first route to the second route.

The ECUs 30 are, for example, devices that collect operation records (logs) of each part of the vehicle V1. The ECUs 30 are connected to, for example, the later-described input/output unit 13 via a communication line 13*b*. For example, the ECUs 30 collect communication logs flowing through the communication line 13*b* and the like in chronological order, and sequentially output the collected communication logs to the in-vehicle control device 10 via the communication line 13*b*. The communication logs are logs of data transmitted and received over a network configured within the vehicle V1 in conformity with a communication protocol such as CAN (Controller Area Network), CAN-FD (CAN with Flexible Data Rate), LIN (Local Interconnect Network), or Ethernet (registered trademark).

The ECUs 30 may be devices (operation system ECUs) that control actuators (e.g., a braking device, a door opening/closing mechanism, an air conditioner, etc.) mounted in the vehicle V1. In this case, the ECUs 30 collect control logs of the actuators in chronological order, and sequentially output the collected control logs to the in-vehicle control device 10 via the communication line 13*b*. The control logs may include, for example, the traveling speed of the vehicle V1, or the depression amount of the brake pedal of the vehicle V1.

The battery 50 is a power source for supplying power to various devices mounted in the vehicle V1, such as the in-vehicle control device 10, the communication device 20, the ECU 30, and the like. If the vehicle V1 includes an engine, the battery 50 is connected to the engine via a generator, and is charged as appropriate while the engine is operating. If the vehicle V1 includes an electric motor, the battery 50 is charged as appropriate from another battery (driving battery: not shown) for driving the electric motor.

The battery 50 includes a main battery 51 and an auxiliary battery 52. The main battery 51 is a power source for normally supplying power to various devices mounted in the vehicle V1. The auxiliary battery 52 is a power source for supplying power to various devices mounted in the vehicle V1 when, for example, the remaining charge of the main battery 51 is a threshold value or less. The auxiliary battery 52 may be, for example, an uninterruptible power supply (UPS).

The battery sensor 41, the ignition switch 42, and the sensor 43 are connected to the later-described input/output unit 13 by the same communication line 13*c*, but may be connected to the input/output unit 13 by separate communication lines (or signal lines). Also, although each of these units 41 to 43 is directly connected to the input/output unit 13 by the communication line 13*c* in the example of FIG. 1, they may be indirectly connected to the input/output unit 13, for example, with another device (e.g., ECU 30) interposed therebetween. As long as the various pieces of information detected in these units 41 to 43 are input to the in-vehicle control device 10, the specific form thereof is not particularly limited.

The battery sensor 41 is a device that monitors various types of information about the battery 50. For example, the battery sensor 41 detects the state of charge (e.g., SOC: State of Charge), state of deterioration (e.g., SOH: State of Health), and state of use (e.g., determination of whether the battery is in a driving state or a stopped state) for each of the main battery 51 and the auxiliary battery 52. The battery sensor 41 may detect the voltages or capacities of the main battery 51 and the auxiliary battery 52. The detection signal of the battery sensor 41 is output from the battery sensor 41 and input to the in-vehicle control device 10 via the communication line 13*c*.

Here, the SOC is also called the charging percentage, and is an index in which a fully charged battery is at 100% and a completely discharged battery is at 0%. The SOH is an index showing the deterioration state of the battery, and is expressed as the ratio between the fully charged capacity of a new battery and the fully-charged capacity of the current battery. An SOH of 100% indicates the condition of a new battery with no deterioration.

If the vehicle V1 includes an engine, the ignition switch 42 is a switch for operating an ignition device or the like that ignites the engine. If the vehicle V1 includes an electric motor, the ignition switch 42 functions as a power switch for starting the electric motor.

The key cylinder of the vehicle V1 can be set to, for example, OFF, ACC (accessory), ON, or START, when the key cylinder is set to ON, the ignition switch 42 is switched on, and when the key cylinder is set to START, a starter motor rotates to start the engine (or the electric motor starts). On the other hand, when the key cylinder is switched to the OFF or ACC position, the ignition switch 42 is switched off and the engine is stopped. A signal indicating the on or off state of the ignition switch 42 is output from the ignition switch 42 and input to the in-vehicle control device 10 via the communication line 13*c*.

The sensor 43 is a device that detects the state of the vehicle V1 itself or the state inside and outside the vehicle V1, and outputs the detected chronological information to the in-vehicle control device 10. For example, the sensor 43 is a drive recorder that collects video logs outside or inside of the vehicle V1. The video log may include audio outside or inside of the vehicle V1. The sensor 43 collects video logs in chronological order, and sequentially outputs the collected video logs to the in-vehicle control device 10 via the communication line 13*c*.

The sensor 43 may be, for example, a LiDAR (Light Detection and Ranging) for monitoring the surrounding area of the vehicle V1. In this case as well, the sensor 43 records information in chronological order and sequentially outputs the recorded information to the in-vehicle control device 10 via the communication line 13*c*.

Internal Configuration of In-Vehicle Control Device 10

The internal configuration of the in-vehicle control device 10 will be described with reference to FIG. 1.

The in-vehicle control device 10 includes a control unit 11, a storage unit 12, the input/output unit 13, a power source circuit 14, and a reading unit 15. These units 11 to 15 are electrically connected by a bus 16.

The control unit 11 includes a circuit configuration (circuitry) such as a processor. Specifically, the control unit 11 includes one or more central processing units (CPUs). The processor included in the control unit 11 may be a graphics processing unit (GPU). In this case, the control unit 11 reads out a computer program stored in the storage unit 12 and executes various computations and controls.

The control unit 11 may include a processor in which a predetermined program is written in advance. For example, the control unit 11 may be an integrated circuit such as a complex programmable logic device (CPLD), a field-programmable gate array (FPGA), or an application specific integrated circuit (ASIC). In this case, the control unit 11 executes various computations and controls based on a program written in advance.

The storage unit 12 has a volatile memory and a non-volatile memory, and stores various types of data. The volatile memory includes, for example, a random access memory (RAM). The non-volatile memory includes, for example, a flash memory, a hard disk drive (HDD), a solid state drive (SSD), or a read only memory (ROM).

The storage unit 12 stores computer programs and various parameters in, for example, a non-volatile memory. The computer programs stored in the storage unit 12 include first software 12*a* and second software 12*b*.

The input/output unit 13 is connected to the communication device 20, the ECUs 30, the battery sensor 41, the ignition switch 42, and the sensor 43 via the communication lines 13*a*, 13*b*, and 13*c*. The input/output unit 13 converts various types of information input from the communication lines 13*a*, 13*b*, and 13*c* into signals that can be read by a computer such as the control unit 11, and takes the information into the in-vehicle control device 10. The various types of information taken into the in-vehicle control device 10 is stored in, for example, the storage unit 12. The various types of information include communication logs and control logs transmitted from the ECUs 30, signals transmitted from the battery sensor 41 and the ignition switch 42, and video logs transmitted from the sensor 43.

The power source circuit 14 is a circuit that converts the power supplied from the battery 50. The power converted in the power source circuit 14 is supplied to each unit of the in-vehicle control device 10.

The reading unit 15 reads information from a computer-readable recording medium 17. The recording medium 17 is, for example, an optical disk such as a CD or a DVD, or a USB flash memory. The reading unit 15 is, for example, an optical drive or a USB terminal. Computer programs and various parameters are recorded in the recording medium 17, and by having the reading unit 15 read the recording medium 17, the computer programs and various parameters are stored in the non-volatile memory of the storage unit 12. The computer programs recorded in the recording medium 17 include the first software 12*a* and the second software 12*b*.

Note that the computer programs including the first software 12*a* and the second software 12*b* may be transmitted from the external device 70 and stored in the storage unit 12 via the communication device 20 and the input/output unit 13.

The control unit 11 transmits the vehicle data TD1 to the external device 70 via the input/output unit 13, the communication device 20, and the network N1. The storage unit of the external device 70 stores the vehicle data TD1. This allows the vehicle data TD1 collected by the in-vehicle control device 10 to be accumulated in the external device 70. The vehicle data TD1 is, for example, various types of information (communication logs, control logs, and video logs) that has been taken into the in-vehicle control device 10 from the input/output unit 13 and stored in the storage unit 12. The vehicle data TD1 may be the various types of information, or may be data obtained by performing predetermined processing (e.g., compression, etc.) on the various types of information.

The vehicle data TD1 is accumulated mainly while the vehicle V1 is traveling. For this reason, for example, the control unit 11 transmits the vehicle data TD1 to the external device 70 by using the mobile communication method 91 while the vehicle V1 is traveling. However, in recent years, the amount of vehicle data TD1 collected by the in-vehicle control device 10 has been increasing, and there are cases where it is not possible to transmit all of the vehicle data TD1 to the external device 70 in time while the vehicle V1 is traveling.

Also, the mobile communication method 91 has problems such as limitations on data communication capacity and high communication fees compared to the short-distance communication method 92. For this reason, even if it is possible in terms of capacity to transmit all of the vehicle data TD1 to the external device 70 while the vehicle V1 is traveling, in order to suppress an increase in the communication cost, it is conceivable to limit the transmission of the vehicle data TD1 while the vehicle V1 is traveling, and to transmit the remaining vehicle data TD1 that was not transmitted while the vehicle V1 was traveling, to the external device 70 using the short-distance communication method 92 while the vehicle V1 is parked near the facility 80.

On the other hand, if the vehicle V1 is parked, the engine of the vehicle V1 is stopped, and therefore the in-vehicle control device 10 needs to transmit the vehicle data TD1 to the external device 70 within the range of the remaining charge of the battery 50.

In view of this, in this embodiment, in order to suppress the power consumption of the battery 50 when the vehicle V1 is parked, the second software 12*b* for power saving, which is different from the first software 12*a* used normally, is activated when the vehicle V1 is parked. The first software 12*a* is software for collecting the vehicle data TD1 in the in-vehicle control device 10, editing the vehicle data TD1, and transmitting the vehicle data TD1, whereas the second software 12*b* is software specialized for transmitting the vehicle data TD1. As a result, it is possible to suppress the power consumption of the battery 50 of the in-vehicle control device 10 by limiting the functions of the in-vehicle control device 10 other than the transmission of the vehicle data TD1.

Also, this embodiment proposes a method for, when a transmittable amount Y1 of the vehicle data TD1 calculated based on the remaining charge of the battery 50 is less than the amount of vehicle data TD1 scheduled to be transmitted (scheduled transmission amount Y2), extracting and transmitting more meaningful vehicle data TD1 within the range of the transmittable amount Y1. This allows the vehicle data TD1 collected by the vehicle V1 to be transmitted to the external device 70 more suitably when the vehicle V1 is parked.

Hereinafter, the control method for the in-vehicle control device 10 will be described in detail.

Control Method

Figure 2:
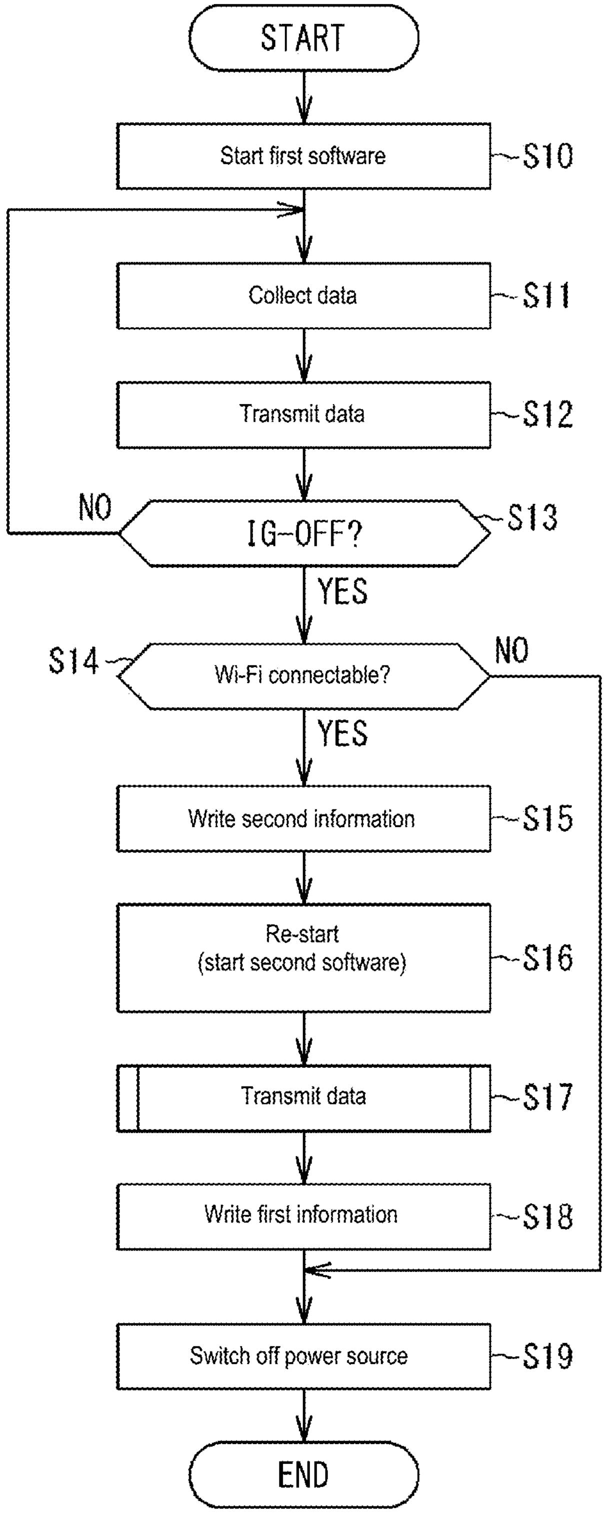
FIG. 2 is a flowchart illustrating a control method according to the embodiment.

FIG. 2 is a flowchart illustrating a control method according to the embodiment. FIG. 2 shows various types of control executed by the control unit 11. These controls are realized by the control unit 11 reading a computer program from the storage unit 12 (or by following a program prewritten in the control unit 11) and executing various computations and processing. The order of the steps shown in FIG. 2 may be changed as appropriate.

First, when a user of the vehicle V1 switches on the ignition switch 42, power is supplied from the battery 50 to the power source circuit 14, and the in-vehicle control device 10 is powered on. At this time, the control unit 11 reads the first software 12*a* from the storage unit 12 and starts up the first software 12*a* (step S10). The storage unit 12 stores startup information indicating whether the first software 12*a* or the second software 12*b* is to be started up when the in-vehicle control device 10 is powered on. The startup information is stored in a non-volatile memory of the storage unit 12, and is maintained even after the in-vehicle control device 10 is powered off.

The startup information includes either information indicating that the first software 12*a* is to be started up (hereinafter referred to as "first information"), or information indicating that the second software 12*b* is to be started up (hereinafter referred to as "second information"). Normally, the startup information includes the first information.

The first software 12*a* does not particularly limit the functions of the in-vehicle control device 10, and is software that, for example, causes the control unit 11 to collect the vehicle data TD1, edit the vehicle data TD1, and transmit the vehicle data TD1. The control unit 11 executes each step from step S11 to step S15 described below in accordance with the first software 12*a*. In particular, the control of steps S11 and S12 that the control unit 11 executes in accordance with the first software 12*a* will be referred to as "first control" as appropriate.

After step S10, the control unit 11 collects the vehicle data TD1 (step S11). First, the control unit 11 collects, from each part of the in-vehicle control system 1, information that is the source of the vehicle data TD1 (hereinafter, referred to as "original data" as appropriate). As described above, the original data is information collected in chronological order in the vehicle V1, such as communication logs, control logs, and video logs. The control unit 11 transmits a signal requesting the original data to each unit of the in-vehicle control system 1 (e.g., the ECUs 30, the sensor 43, etc.), and each unit transmits the original data to the in-vehicle control device 10 in response to the signal. The control unit 11 causes the storage unit 12 to store the received original data.

Next, the control unit 11 creates the vehicle data TD1 by editing the received original data as appropriate, and causes the storage unit 12 to store the created vehicle data TD1. Note that if the original data received by the control unit 11 is transmitted to the external device 70 as the vehicle data TD1 as-is, this step may be omitted. This completes step S11.

After step S11, the control unit 11 transmits the vehicle data TD1 to the external device 70 (step S12). Specifically, the control unit 11 divides the vehicle data TD1 into a plurality of pieces of divided data D (e.g., frames, files, etc.) and causes the input/output unit 13 to sequentially output the plurality of pieces of divided data D. The plurality of pieces of divided data D are divided, for example, according to the data capacity, and are arranged in chronological order by being given file names in the order of the time when the data was acquired. The plurality of pieces of divided data D are sequentially transmitted from the input/output unit 13 to the external device 70 via the communication device 20 and the network N1.

At this time, the communication device 20 communicates with the external device 70 through the first route (mobile communication method 91). Note that when the ignition switch 42 is on and the communication device 20 is capable of communicating with the router 81 in the facility 80 using the short-distance communication method 92, the communication device 20 may communicate with the external device 70 through the second route. For example, if the facility 80 is a factory and the vehicle V1 is a work vehicle (e.g., a cleaning vehicle, a transport vehicle, etc.) that performs work inside and outside of the facility 80, the vehicle V1 keeps the ignition switch 42 on for a relatively long period of time near the facility 80 in some cases. In this case, the communication device 20 may communicate with the external device 70 through the second route.

Note that the first software 12*a* may limit the transmission of the vehicle data TD1 to the external device 70 depending on the operation of the communication device 20, in consideration of the above-mentioned communication cost and the like. For example, if the communication device 20 communicates with the external device 70 through the first route, step S12 may be skipped.

Next, the control unit 11 determines whether or not the ignition switch 42 has been switched off based on a signal transmitted from the ignition switch 42 to the in-vehicle control device 10 (step S13). If the ignition switch 42 is on (NO in step S13), the control unit 11 returns to step S11.

If the ignition switch 42 is off (YES in step S13), the control unit 11 determines whether or not the communication device 20 is capable of communicating with the router 81 through the short-distance communication method 92 (step S14). For example, if the communication device 20 discovers a router 81 with which it can communicate using the short-distance communication method 92 (e.g., a router 81 with which the communication device 20 has been paired in the past), the communication device 20 automatically connects to that router 81. Then, when the communication device 20 establishes a connection with the router 81, the communication device 20 generates connection information and transmits the connection information to the control unit 11. The control unit 11 determines, based on the connection information, that the communication device 20 is capable of communicating with the router 81 using the short-distance communication method 92.

If the communication device 20 cannot communicate with the router 81 using the short-distance communication method 92 (NO in step S14), the control unit 11 skips steps S15 to S18 described below and powers off the in-vehicle control device 10 (step S19). For example, in step S19, the control unit 11 issues an operation command to the power source circuit 14 to stop the supply of power from the power source circuit 14 to the units 11 to 15 of the in-vehicle control device 10.

Note that step S14 may be omitted. In this case, even if the communication device 20 cannot communicate with the router 81 using the short-distance communication method 92, as long as the ignition switch 42 is off, the control unit 11 advances the processing to the next step S15.

Next, the control unit 11 writes the second information into the startup information in the storage unit 12 (step S15). For example, the control unit 11 overwrites the first information, which has been previously written as the startup information in the storage unit 12, with the second information.

After step S15, the control unit 11 restarts the in-vehicle control device 10 (step S16). That is, the control unit 11 resets information such as parameters stored in the storage unit 12 (particularly, the volatile memory) through the previous control (e.g., the first control) by temporarily powering off the in-vehicle control device 10.

Thereafter, the in-vehicle control device 10 is powered on. At this time, since the startup information in the storage unit 12 includes the second information, the control unit 11 reads the second software 12*b* from the storage unit 12 and starts up the second software 12*b*. As a result, the control unit 11 can operate the second software 12*b* without being influenced by parameters accumulated during operation of the first software 12*a*, and therefore it is possible to reduce the risk of malfunction of the control unit 11 or the like, and more reliably suppress consumption of the battery 50 during operation of the second software 12*b*. This completes step S16.

The second software 12*b* is software that limits the functions of the units of the in-vehicle control device 10 so as to suppress power consumption in the in-vehicle control device 10, as compared to the first software 12*a*. Specifically, the second software 12*b* does not include control related to collection and editing of the vehicle data TD1, and the control unit 11 executes each step from step S17 to step S19 described below in accordance with the second software 12*b*. In particular, the control of step S17 that the control unit 11 executes in accordance with the second software 12*b* is referred to as "second control" as appropriate. At step S18, the control writes the first information prior to the supply of power from the power source circuit 14 being stopped at step S19.

After step S16, the control unit 11 transmits the vehicle data TD1 to the external device 70 (step S17: data transmission step).

Figure 3:
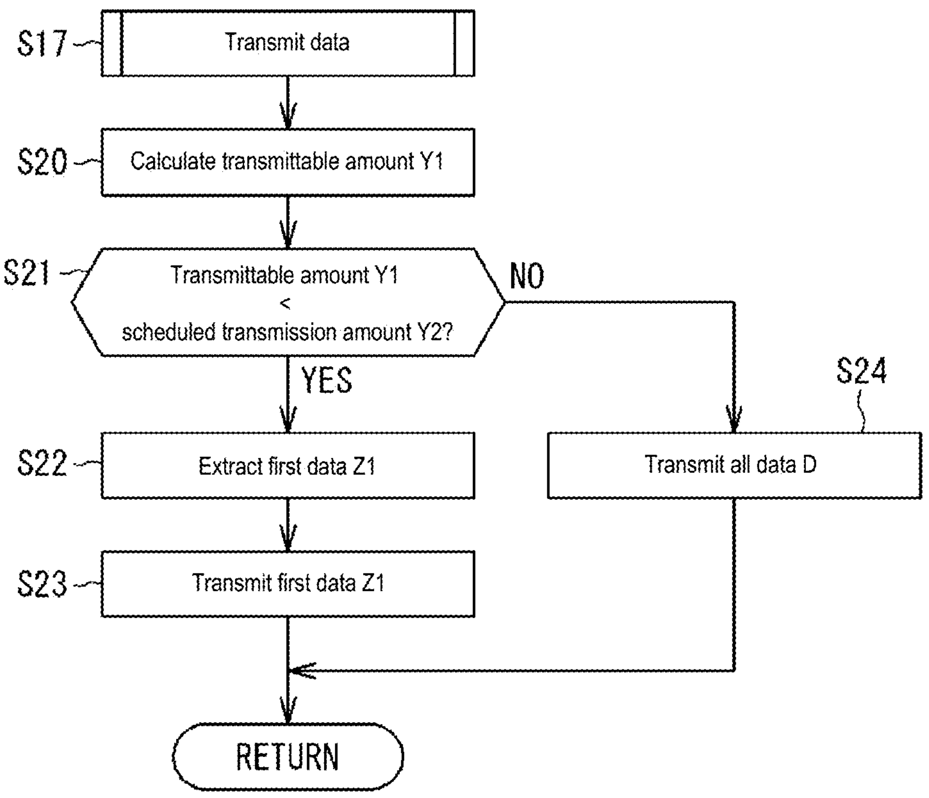
FIG. 3 shows a subroutine illustrating details of a data transmission step in FIG. 2.

FIG. 3 is a subroutine showing the details of the data transmission step shown in FIG. 2.

First, the control unit 11 calculates the transmittable amount Y1 of the vehicle data TD1 based on the remaining charge of the battery 50 (step S20). For example, the control unit 11 acquires information on the remaining charge of the battery 50 (remaining charge information) based on a detection signal of the battery sensor 41.

Specifically, if the battery sensor 41 outputs the SOC (e.g., 80%) and SOH (e.g., 90%) of the main battery 51 as detection signals, the control unit 11 acquires the remaining charge of the main battery 51 by multiplying the fully charged capacity of the main battery 51 when it was new (e.g., the fully charged capacity according to the specifications) by the SOC and SOH (e.g., the fully-charged capacity×80%×90%). Similarly, the control unit 11 acquires the remaining charge of the auxiliary battery 52 and adds the remaining charge of the main battery 51 and the remaining charge of the auxiliary battery 52 together to obtain the remaining charge of the battery 50.

Also, if the battery sensor 41 outputs the capacities of the main battery 51 and the auxiliary battery 52 as detection signals, the control unit 11 may acquire the sum of the capacities of the main battery 51 and the auxiliary battery 52 as the remaining charge of the battery 50. If the battery sensor 41 outputs the voltages of the main battery 51 and the auxiliary battery 52 as detection signals, the control unit 11 may predict the remaining charge of the battery 50 from these voltages using a known method.

Note that if the battery sensor 41 outputs a detection signal to the ECU 30, the ECU 30 may generate remaining charge information of the battery 50 based on the detection signal, and transmit the generated remaining charge information to the in-vehicle control device 10 via the communication line 13*b*, thereby allowing the control unit 11 to acquire the remaining charge information. That is, it is sufficient that the control unit 11 acquires the remaining charge information, and the calculation of the remaining charge information may be executed by a unit other than the control unit 11 (the ECUs 30, the battery sensor 41, etc.).

Next, the control unit 11 translates the remaining charge of the battery 50 into the transmittable amount Y1 of the vehicle data TD1 based on a predetermined parameter A1 stored in the storage unit 12. For example, if the parameter A1 is the amount of vehicle data TD1 (MB) that the in-vehicle control system 1 can transmit per unit remaining charge (discharge capacity: 1 mAh) of the battery 50, the control unit 11 calculates the transmittable amount Y1 by multiplying a remaining charge X1 of the battery 50 by the parameter A1 ($Y1=A1\cdot X1$).

Note that in addition to the parameter A1, various margin values B1 may also be taken into account (e.g., $Y1=A1\cdot X1-B1$). Also, the above-described calculation method is merely an example, and the control unit 11 may calculate the transmittable amount Y1 of the vehicle data TD1 from the remaining charge of the battery 50 using another method. This completes step S20.

Next, the control unit 11 determines whether or not the transmittable amount Y1 calculated in step S20 is smaller than the scheduled transmission amount Y2 of the vehicle data TD1 (step S21). Here, the scheduled transmission amount Y2 means the amount of the vehicle data TD1 that the control unit 11 is to transmit to the external device 70 when the remaining charge of the battery 50 is sufficient (e.g., when the battery 50 is in a charged state). For example, the scheduled transmission amount Y2 is a data amount including all of the vehicle data TD1 collected by the control unit 11.

Figure 4:
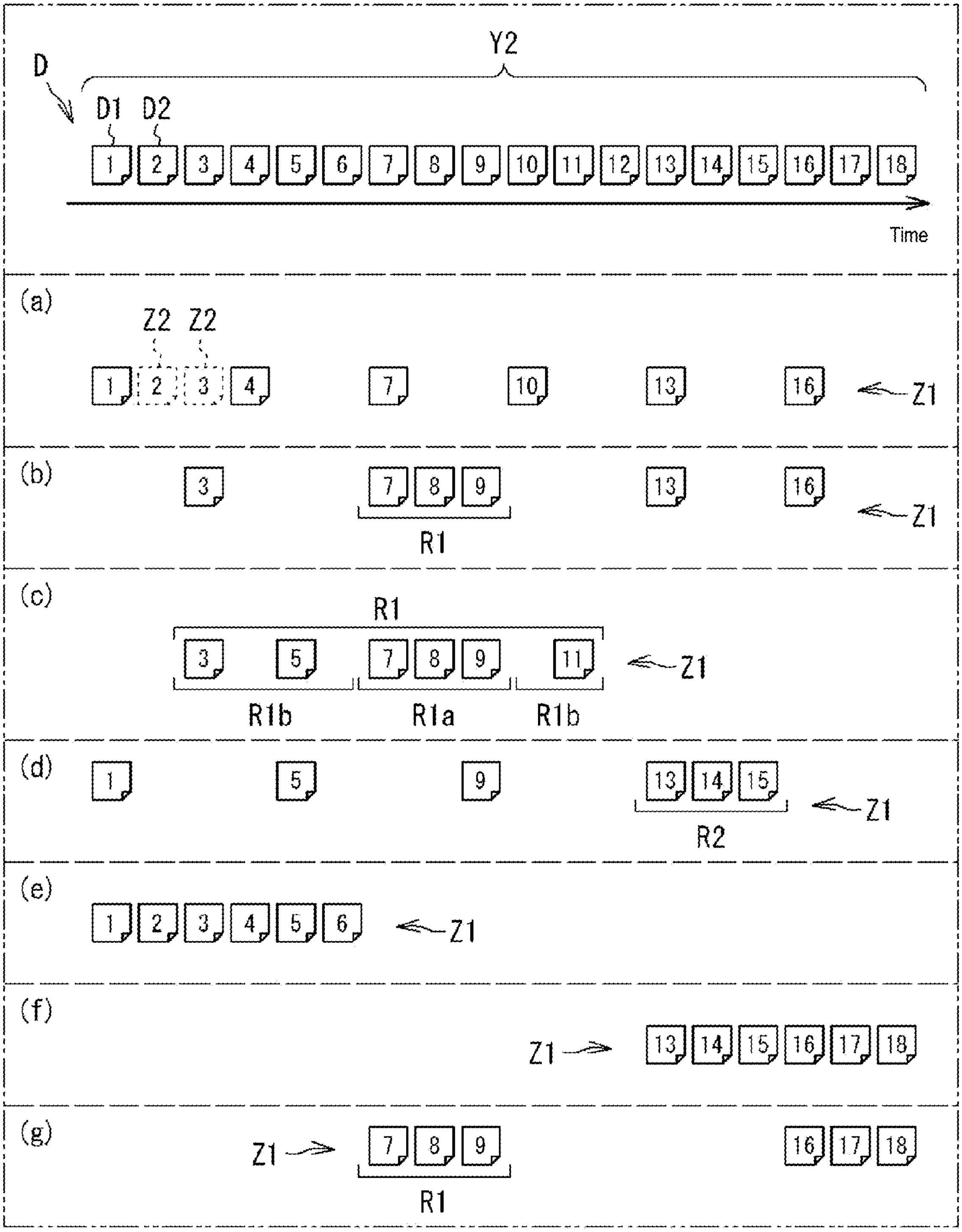
FIG. 4 is a schematic diagram illustrating extraction of first data according to the embodiment.

FIG. 4 is a schematic diagram illustrating extraction control performed by the control unit 11.

In FIG. 4, the horizontal axis represents the time associated with the vehicle data TD1. For example, if the vehicle data TD1 is a video log acquired in chronological order by the sensor 43, the horizontal axis represents the time when the video was acquired. The vehicle data TD1 is divided into a plurality of pieces of divided data D, for example, for each predetermined capacity (or for each predetermined time), and is arranged in chronological order. In the example of FIG. 4, a total of 18 pieces of divided data D are arranged in chronological order.

Note that the divided data D may be arranged in an order other than chronological order. For example, if the vehicle data TD1 is a log acquired for each traveling position, the divided data D may be arranged in the order of the positions at which the vehicle data TD1 was acquired.

In the example of FIG. 4, the scheduled transmission amount Y2 is a data amount including 18 pieces of divided data D. In the following description, when distinguishing between the 18 pieces of divided data D, the data will be referred to as data D1, D2, D3, . . . , and D18 in order starting from the earliest data.

If the transmittable amount Y1 is greater than or equal to the scheduled transmission amount Y2 (NO in step S21), the control unit 11 transmits all of the divided data D corresponding to the scheduled transmission amount Y2 to the external device 70 (step S24). In the example of FIG. 4, the control unit 11 transmits all of the data D1 to D18 to the external device 70.

If the transmittable amount Y1 is smaller than the scheduled transmission amount Y2 (YES in step S21), when the control unit 11 attempts to transmit all of the divided data D corresponding to the scheduled transmission amount Y2 to the external device 70, there is a risk that the battery 50 will run out of charge partway through transmitting important divided data D to the external device 70. For this reason, if the transmittable amount Y1 is smaller than the scheduled transmission amount Y2, the control unit 11 extracts first data Z1 that fits within the transmittable amount Y1 from the plurality of pieces of divided data D (extraction control: step S22).

For example, the control unit 11 extracts the first data Z1 by thinning out the plurality of pieces of divided data D uniformly over time in accordance with the transmittable amount Y1. Specifically, the control unit 11 samples the plurality of pieces of divided data D based on a sampling value Y3 ($Y3=Y2/Y1$) obtained by dividing the scheduled transmission amount Y2 by the transmittable amount Y1. For example, when the sampling value is "3" (i.e., when the scheduled transmission amount Y2 is three times the transmittable amount Y1), the control unit 11 extracts one out of every three pieces of the plurality of pieces of divided data D in chronological order. As a result, as shown in FIG. 4(*a*), the data D1, D4, D7, D10, D13, and D16 (i.e., six pieces of divided data D) are extracted as the first data Z1.

Of the plurality of pieces of divided data D corresponding to the scheduled transmission amount Y2, data that is not extracted as the first data Z1 is referred to as "second data Z2" as appropriate. In FIG. 4(*a*), the data D2, D3, D5, D6, D8, D9, D11, D12, D14, D15, D17, and D18 correspond to the second data Z2. That is, the second data Z2 is different from the first data Z1.

Next, the control unit 11 transmits the first data Z1 extracted in step S22 to the external device 70 (first transmission control: step S23). In the first transmission control, the control unit 11 does not transmit the second data Z2 to the external device 70.

Since the first data Z1 is data obtained by sampling a plurality of pieces of divided data D uniformly over time, even if the remaining charge of the battery 50 is low, all divided data D in the time span corresponding to the scheduled transmission amount Y2 can be transmitted evenly. As a result, the external device 70 can analyze the overall trend of the vehicle data TD1 even if the total amount of the vehicle data TD1 that can be transmitted is low.

The sampling value Y3 may also take into account various margin values B2 in addition to the transmittable amount Y1 and the scheduled transmission amount Y2 (e.g., $Y3=Y2/Y1-B2$). This makes it possible to transmit the first data Z1 to the external device 70 more reliably even if unexpected power consumption occurs in the battery 50. In this way, the in-vehicle control device 10 can more appropriately transmit the vehicle data TD1 collected in the vehicle V1 to the external device 70 when the vehicle V1 is parked.

MODIFIED EXAMPLES

Modified examples of the embodiment will be described below. In the modified examples, the same components as those in the embodiment are denoted by the same reference numerals and description thereof is omitted.

Modified Example 1 of Extraction Control

In the extraction control (step S22) according to the embodiment described above, the control unit 11 extracts, from the plurality of pieces of divided data D, data sampled uniformly over time according to the transmittable amount Y1, as the first data Z1. However, the content of the extraction control is not limited to this.

As shown in FIG. 4(*b*), the extraction control may extract data collected in a predetermined travel region R1 from among the plurality of pieces of divided data D as the first data Z1 (first extraction control). The travel region R1 is a region that is stored in advance in the storage unit 12 as a region in which accidents are particularly likely to occur, for example, among roads on which the vehicle V1 travels. The travel region R1 may be, for example, an intersection, a tunnel, a region with a narrowing road width, a merging region, or a slope, or may be a region with a high accident rate in the past.

For example, if the vehicle data TD1 is a video log acquired in chronological order by the sensor 43, the control unit 11 extracts the vehicle data TD1 (plurality of pieces of divided data D) in which the location where the sensor 43 acquired the video log is included in the travel region R1 as the first data Z1. In FIG. 4(*b*), the data D7 to D9 are data collected in the travel region R1, and the control unit 11 extracts the data D7 to D9 as the first data Z1.

If the total amount of the data D7 to D9 extracted by the control unit 11 is less than the transmittable amount Y1, the battery 50 has enough charge to transmit the vehicle data TD1 in addition to the data D7 to D9. For this reason, the control unit 11 further extracts the first data Z1 by sampling the remaining data D1 to D6, D10 to D18 uniformly over time according to the remaining amount of the transmittable amount Y1 (i.e., the amount obtained by subtracting the total amount of the data D7 to D9 from the transmittable amount Y1). In FIG. 4(*b*), the data D3, D13, and D16 are additionally extracted as the first data Z1.

Since the first data Z1 includes data collected in the travel region R1, even if the remaining charge of the battery 50 is low, the in-vehicle control device 10 can transmit data of a specific region where there is a circumstance such as accidents being likely to occur, to the external device 70. As a result, even if the total amount of the vehicle data TD1 that can be transmitted is reduced, the external device 70 can preferentially acquire the vehicle data TD1 that is useful for road condition analysis and accident analysis.

Also, after extracting the vehicle data TD1 in the travel region R1, if there is any remaining amount in the transmittable amount Y1, the control unit 11 samples the remaining vehicle data TD1 uniformly over time to additionally extract the first data Z1. This makes it possible to transmit all of the vehicle data TD1 in the time span corresponding to the scheduled transmission amount Y2 evenly while giving priority to transmitting the vehicle data TD1 that is more useful for analysis.

Modified Example 2 of Extraction Control

In the example of FIG. 4(*b*), the control unit 11 extracts all of the divided data D included in the travel region R1. However, for example, if extracting all of the divided data D contained in the travel region R1 would result in insufficient charge in the battery 50, it is possible to preferentially extract the divided data D in a region of the travel region R1 where accidents are particularly likely to occur, and thin out the divided data D in the other regions.

In the example of FIG. 4(*c*), the travel region R1 includes nine pieces of data D3 to D11 and the total amount of data exceeds the transmittable amount Y1, and therefore it is not possible to transmit all of the data D3 to D11 to the external device 70, and it is necessary to select and discard the data D3 to D11.

In such a case, the control unit 11 divides the travel region R1 into a first travel region R1*a* and a second travel region R1*b*. The first travel region R1*a* is, for example, a region of the travel region R1 where accidents are more likely to occur, and specifically, if the travel region R1 is a tunnel, the first travel region R1*a* is near the entrance of the tunnel. The second travel region R1*b* is a region of the travel region R1 that does not fall into the first travel region R1*a* and is adjacent to the first travel region R1*a*. Note that the first travel region R1*a* and the second travel region R1*b* may be stored in the storage unit 12 in advance.

In FIG. 4(*c*), data D7 to D9 are data collected in the first travel region R1*a*, and data D3 to D6, D10, and D11 are data collected in the second travel region R1*b*.

When the first data Z1 is extracted from the travel region R1, the control unit 11 first preferentially extracts the data D7 to D9 collected in the first travel region R1*a* as the first data Z1 (priority control). Next, the control unit 11 further extracts, from the data D3 to D6, D10, and D11 collected in the second travel region R1*b*, data D3, D5, and D11 that are sampled uniformly over time according to the remaining amount of the transmittable amount Y1 (i.e., the remaining amount obtained by subtracting the first data Z1 extracted in the priority operation from the transmittable amount Y1), as the first data Z1.

Since the first data Z1 preferentially includes data collected in the first travel region R1*a*, the in-vehicle control device 10 can transmit particularly useful data to the external device 70 even when the remaining charge of the battery 50 is low. As a result, even if the total amount of the vehicle data TD1 that can be transmitted is reduced, the external device 70 can more reliably obtain vehicle data TD1 that is more useful for road condition analysis and accident analysis.

Modified Example 3 of Extraction Control

As shown in FIG. 4(*d*), the extraction control may extract, from the vehicle data TD1, data collected in a region R2 in which the vehicle V1 is in a predetermined traveling state, as the first data Z1 (second extraction control). The predetermined traveling state is, for example, a state in which the speed of the vehicle V1 exceeds a predetermined speed VY1 (high-speed traveling state). The predetermined speed VY1 may be, for example, a value obtained by adding a predetermined margin value B3 to a speed limit VX1 of the road on which the vehicle V1 is traveling (VY1=VX1+B3).

Also, the predetermined traveling state may be, for example, a state in which the absolute value of the acceleration of the vehicle V1 exceeds a predetermined value, such as when the vehicle V1 suddenly accelerates or suddenly decelerates (abnormal traveling state). In this way, when the vehicle V1 is in a high-speed traveling state or is in an abnormal traveling state, there is a high probability that the vehicle V1 will be involved in an accident, and there is a high likelihood that an abnormality has further occurred in the surrounding area of the vehicle V1, and therefore the vehicle data TD1 collected in such a region R2 is useful for road condition analysis and accident analysis.

The control unit 11 extracts the vehicle data TD1 included in the region R2 as the first data Z1. In FIG. 4(*d*), the data D13 to D15 are data collected in the region R2, and the control unit 11 extracts the data D13 to D15 as the first data Z1.

If the total amount of the data D13 to D15 extracted by the control unit 11 is less than the transmittable amount Y1, the battery 50 has enough capacity to transmit the vehicle data TD1 in addition to the data D13 to D15. For this reason, the control unit 11 further extracts the first data Z1 by sampling the remaining data D1 to D12 and D16 to D18 uniformly over time according to the remaining amount of the transmittable amount Y1 (i.e., the amount obtained by subtracting the transmittable amount Y1 by the total amount of the data D13 to D15). In FIG. 4(*d*), the data D1, D5, and D9 are additionally extracted as the first data Z1.

Since the first data Z1 includes data collected in the region R2, even if the remaining charge of the battery 50 is low, the in-vehicle control device 10 can transmit data of a specific region having a circumstance such as accidents being likely to occur there, to the external device 70. As a result, even if the total amount of the vehicle data TD1 that can be transmitted is small, the external device 70 can preferentially acquire the vehicle data TD1 that is useful for road condition analysis and accident analysis.

Also, if there is any remaining amount in the transmittable amount Y1 after extracting the vehicle data TD1 in the region R2, the control unit 11 samples the remaining vehicle data TD1 uniformly over time to additionally extract the first data Z1. This makes it possible to evenly transmit all of the vehicle data TD1 in the time span corresponding to the scheduled transmission amount Y2 while giving priority to transmitting the vehicle data TD1 that is more useful for analysis.

Modified Example 4 of Extraction Control

As shown in FIG. 4(*e*), in the extraction control, the control unit 11 may sequentially extract, as the first data Z1, data that is earlier in time out of the vehicle data TD1 corresponding to the scheduled transmission amount Y2. In FIG. 4(*e*), the data D1 to D6 are extracted as the first data Z1.

Modified Example 5 of Extraction Control

As shown in FIG. 4(*f*), in the extraction control, the control unit 11 may sequentially extract, as the first data Z1, data that is later in time out of the vehicle data TD1 corresponding to the scheduled transmission amount Y2. In FIG. 4(*f*), the data D13 to D18 are extracted as the first data Z1.

Modified Example 6 of Extraction Control

The above-mentioned extraction methods may be combined as appropriate.

For example, as shown in FIG. 4(*g*), the control unit 11 may preferentially extract the data D7 to D9 collected in the travel region R1 as the first data Z1, and then additionally extract the data D16 to D18 that are later in time out of the vehicle data TD1 corresponding to the scheduled transmission amount Y2 as the first data Z1.

Also, the control unit 11 may preferentially extract data collected in the travel region R1 as the first data Z1, and then extract data collected in the region R2 as the first data Z1.

Modified Example of Vehicle Parking Determination

In the above embodiment, the control unit 11 determines whether or not the vehicle V1 is parked based on the state of the ignition switch 42 (step S13). However, the control unit 11 may determine whether or not the vehicle V1 is parked based on another determination index.

For example, if the vehicle V1 is parked and the battery 50 is no longer being charged, all (or some) of the power of the in-vehicle control device 10 may be supplied from the auxiliary battery 52 in order to suppress power consumption in the main battery 51. Also, in some cases, the auxiliary battery 52 is not used for driving while the vehicle V1 is traveling, and the auxiliary battery 52 is solely charged. In such a case, the control unit 11 can determine that the vehicle V1 is parked if the auxiliary battery 52 is in a driving state.

Specifically, the control unit 11 determines, based on a detection signal from the battery sensor 41, whether the auxiliary battery 52 is in a driving state or in a stopped state. If the control unit 11 determines that the auxiliary battery 52 is in a driving state (YES in step S13), the processing advances to step S14.

Other

In the above embodiment, the control unit 11 extracts the first data Z1 within the range of the transmittable amount Y1 calculated according to the remaining charge of the battery 50, and transmits the first data Z1 to the external device 70. At this time, the remaining second data Z2 is not transmitted to the external device 70.

For example, after the first data Z1 is transmitted, the battery 50 may be charged while the vehicle V1 is parked. Examples of this include a case where the vehicle V1 is an electric vehicle that is connected to a charging port some time after being parked. In this case, the control unit 11 may transmit the remaining second data Z2 to the external device 70 if the remaining charge of the battery 50 increases based on, for example, a detection signal from the battery sensor 41. This allows the external device 70 to acquire the remaining vehicle data TD1.

SUPPLEMENTARY NOTES

The above description includes the following additional features.

Supplementary Note 1

An in-vehicle control device to be mounted in a vehicle, including: a control unit configured to execute first control for collecting vehicle data in the vehicle while the vehicle is traveling, and second control for, while the vehicle is parked, transmitting the vehicle data to an external device that is provided outside of the vehicle and is configured to communicate with the in-vehicle control device via a network;

and a storage unit that stores first software configured to execute the first control and second software configured to execute the second control, in which the control unit does not collect the vehicle data while the second control is being executed by the second software.

Supplementary Note 2

A control method for controlling an in-vehicle control device mounted in a vehicle, including: a first control step of collecting vehicle data in the vehicle while the vehicle is traveling; and a second control step of transmitting the vehicle data, when the vehicle is parked, to an external device that is provided outside of the vehicle and is configured to communicate with the in-vehicle control device via a network, in which the first control step is executed while a control unit of the in-vehicle control device is running first software stored in a storage unit of the in-vehicle control device, the second control step is executed while the control unit of the in-vehicle control device is running second software stored in a storage unit of the in-vehicle control device, and the control unit does not collect the vehicle data while the second software is executing the second control step.

Supplementary Note 3

A computer program for controlling an in-vehicle control device mounted in a vehicle, the computer program causing a computer to execute a first control step of collecting vehicle data in the vehicle while the vehicle is traveling; and a second control step of transmitting the vehicle data, when the vehicle is parked, to an external device that is provided outside of the vehicle and is configured to communicate with the in-vehicle control device via a network, in which the first control step is executed while a control unit of the in-vehicle control device is running first software stored in a storage unit of the in-vehicle control device, the second control step is executed while the control unit of the in-vehicle control device is running second software stored in a storage unit of the in-vehicle control device, and the control unit does not collect the vehicle data while the second software is executing the second control step.

APPENDIX

Note that at least some of the above-described embodiments and modified examples may be combined with each other as appropriate. Also, the embodiments and modified examples disclosed herein are to be considered illustrative in all respects and not limiting. The scope of the present disclosure is indicated by the claims, and all modifications within the meaning and scope of the claims are intended to be encompassed therein.

The invention claimed is:

1. An in-vehicle control device to be mounted in a vehicle, comprising a control unit configured to transmit at least some of vehicle data collected in the vehicle to an external device that is provided outside of the vehicle and is configured to communicate with the in-vehicle control device via a network, wherein when an ignition switch of the vehicle is off, the control unit executes:

a calculation control for calculating a transmittable amount representing a quantity of the vehicle data that can be transmitted based on a remaining battery charge of the vehicle and, without reducing the remaining battery charge below a threshold, compares the transmittable amount with a scheduled transmission amount;

an extraction control that, when the transmittable amount is less than the scheduled transmission amount, extracts a first data whose aggregate size is less than the transmittable amount from the vehicle data; and a first transmission control for transmitting the first data to the external device and not transmitting a second data that is different from the first data out of the vehicle data to the external device.

2. The in-vehicle control device according to claim 1, wherein the extraction control includes a first extraction operation of extracting data collected in a predetermined travel region out of the vehicle data, as the first data.

3. The in-vehicle control device according to claim 2, wherein:

the travel region includes a first travel region and a second travel region adjacent to the first travel region, and the first extraction control includes:

priority control for extracting data collected in the first travel region out of the vehicle data, as the first data; and control for further extracting, from data collected in the second travel region out of the vehicle data, data sampled uniformly over time according to a remaining amount obtained by subtracting the first data extracted in preferential control from the transmittable amount, as the first data.

4. The in-vehicle control device according to claim 1, wherein the extraction control includes a second extraction control for extracting, out of the vehicle data, at least one of data collected while a speed of the vehicle exceeds a predetermined speed and data collected while an absolute value of acceleration of the vehicle exceeds a predetermined value, as the first data.

5. The in-vehicle control device according to claim 1, wherein the extraction control includes control for extracting, from the vehicle data, data sampled uniformly over time according to the transmittable amount, as the first data.

6. The in-vehicle control device according to claim 1, wherein after executing the first transmission control, the control unit executes second transmission control for transmitting the second data to the external device if the remaining battery charge of the vehicle has increased.

7. The in-vehicle control device according to claim 1, wherein the control unit acquires the remaining battery charge based on an SOC and an SOH of the battery mounted in the vehicle.

8. The in-vehicle control device according to claim 1, wherein:

the control unit communicates with the external device via a communication device mounted in the vehicle, the communication device is capable of switching between a first route for communicating with the external device using a mobile communication method, and a second route for communicating with the external device via a router and a modem using a short-distance communication method in which a range of radio waves is shorter than in the mobile communication method, and the first transmission control is executed when the communication device is communicating with the external device through the second route.

9. The in-vehicle control device according to claim 1, wherein:

the control unit executes a first control for collecting the vehicle data while the vehicle is traveling, the control unit executes a second control including the calculation control, the extraction control, and the first transmission control while the vehicle is parked, and the control unit does not collect the vehicle data while executing the second control.

10. The in-vehicle control device according to claim 9, further including:

a storage unit that stores a first software configured to execute the first control and a second software configured to execute the second control, wherein the control unit executes the first software while the vehicle is traveling, when the ignition is switched off, the control unit starts the second software, and when the ignition is switched on after the first transmission control, the control unit starts the first software.

11. A control method for controlling an in-vehicle control device to be mounted in a vehicle, comprising:

a calculation step of calculating, when an ignition switch of the vehicle is switched off, a transmittable amount representing a quantity of a vehicle data that can be transmitted based on a remaining battery charge of the vehicle and, without reducing the remaining battery charge below a threshold, compares the transmittable amount with a scheduled transmission amount, wherein the vehicle data is collected in the vehicle;

an extraction step of extracting, when the transmittable amount is less than the scheduled transmission amount, a first data whose aggregate size is less than the transmittable amount from the vehicle data; and a first transmission step of transmitting the first data to an external device and not transmitting a second data that is different from the first data out of the vehicle data to the external device, wherein the external device is provided outside of the vehicle and is configured to communicate with the in-vehicle control device via a network.

12. A non-transitory computer readable medium comprising programming instructions for a control program that controls an in-vehicle control device mounted in a vehicle, when executed by a computer, cause the computer to execute:

a calculation step of calculating, when an ignition switch of the vehicle is switched off, a transmittable amount representing a quantity of a vehicle data that can be transmitted based on a remaining battery charge of the vehicle and, without reducing the remaining battery charge below a threshold, compares the transmittable amount with a scheduled transmission amount, wherein the vehicle data is collected in the vehicle is capable of being transmitted to an external device that is provided outside of the vehicle;

an extraction step of extracting, when the transmittable amount is less than the scheduled transmission amount, a first data whose aggregate size is less than the transmittable amount from the vehicle data; and a first transmission step of transmitting the first data to an external device and not transmitting a second data that is different from the first data out of the vehicle data to the external device, wherein the external device is provided outside of the vehicle and is configured to communicate with the in-vehicle control device via a network.

* * * * *